(12) United States Patent
Zhou et al.

(10) Patent No.: US 12,287,360 B1
(45) Date of Patent: Apr. 29, 2025

(54) GaN HEMT DEVICE FOR IRRADIATION DAMAGE DETECTION AND DETECTION AND MANUFACTURING METHOD THEREFOR

(71) Applicant: NANJING UNIVERSITY, Jiangsu (CN)

(72) Inventors: Feng Zhou, Jiangsu (CN); Can Zou, Jiangsu (CN); Hai Lu, Jiangsu (CN); Weizong Xu, Jiangsu (CN); Dong Zhou, Jiangsu (CN); Fangfang Ren, Jiangsu (CN)

(73) Assignee: NANJING UNIVERSITY, Nanjing (CN)

( * ) Notice: Subject to any disclaimer, the term of this patent is extended or adjusted under 35 U.S.C. 154(b) by 0 days.

(21) Appl. No.: 19/004,581

(22) Filed: Dec. 30, 2024

(30) Foreign Application Priority Data

Jun. 12, 2024 (CN) .......................... 202410751811.9

(51) Int. Cl.
*G01R 31/00* (2006.01)
*G01R 31/26* (2020.01)
(Continued)

(52) U.S. Cl.
CPC ....... *G01R 31/002* (2013.01); *G01R 31/2621* (2013.01); *G01R 31/27* (2013.01);
(Continued)

(58) Field of Classification Search
CPC .. G01R 31/002; G01R 31/2621; G01R 31/27; G01R 31/2884; G01R 31/3004;
(Continued)

(56) References Cited

U.S. PATENT DOCUMENTS

| | | | |
|---|---|---|---|
| 6,067,154 A | 5/2000 | Hossain et al. | |
| 2003/0011026 A1* | 1/2003 | Colby | H05K 9/0066 257/355 |

(Continued)

FOREIGN PATENT DOCUMENTS

| | | |
|---|---|---|
| CN | 102721913 A | 10/2012 |
| CN | 111722075 A | 9/2020 |

(Continued)

OTHER PUBLICATIONS

1st Office Action of counterpart Chinese Patent Application No. 202410751811.9 issued on Jul. 18, 2024.
(Continued)

*Primary Examiner* — Raul J Rios Russo (57) ABSTRACT

The present invention discloses a GaN HEMT device for irradiation damage detection which comprises a substrate layer, a gallium nitride layer, a barrier layer and a dielectric layer. A p-type gallium nitride layer is provided on the barrier layer. A drain and a source are respectively located at an inner side and an outer side of the p-type gallium nitride layer and provided on the gallium nitride layer. A Schottky metal layer is provided on the p-type gallium nitride layer. A first ohmic metal layer and a second ohmic metal layer are respectively located at an inner side and an outer side of the p-type gallium nitride layer and provided on the barrier layer. The second ohmic metal layer includes inner gear electrodes and outer gear electrodes, which are interdigital with each other.

6 Claims, 6 Drawing Sheets

(51) Int. Cl.
  *G01R 31/27* (2006.01)
  *G01R 31/28* (2006.01)
  *G01R 31/30* (2006.01)
  *G01R 31/317* (2006.01)
  *G01R 31/3187* (2006.01)
  *H01L 21/66* (2006.01)

(52) U.S. Cl.
  CPC ..... *G01R 31/2884* (2013.01); *G01R 31/3004* (2013.01); *G01R 31/31701* (2013.01); *G01R 31/3187* (2013.01); *H01L 22/34* (2013.01); *H01L 2924/00* (2013.01); *H01L 2924/0002* (2013.01)

(58) Field of Classification Search
  CPC .......... G01R 31/31701; G01R 31/3187; H01L 2924/00; H01L 22/34; H01L 2924/0002
  USPC ...................................................... 324/750.3
  See application file for complete search history.

(56) References Cited

U.S. PATENT DOCUMENTS

2005/0077907 A1* 4/2005 Parker ................ G01R 31/2853
                                                         324/538
2010/0164521 A1* 7/2010 Chen ....................... H01L 22/34
                                                         324/755.01

FOREIGN PATENT DOCUMENTS

CN      112236868 A      1/2021
CN      115775745 A      3/2023

OTHER PUBLICATIONS

Notice of Allowance of counterpart Chinese Patent Application No. 202410751811.9 issued on Aug. 21, 2024.

* cited by examiner

GaN HEMT DEVICE FOR IRRADIATION DAMAGE DETECTION AND DETECTION AND MANUFACTURING METHOD THEREFOR

CROSS-REFERENCE TO RELATED APPLICATIONS

The present application claims priority benefits to Chinese Patent Application No. 202410751811.9 filed on Jun. 12, 2024, the disclosure of which is incorporated herein by reference in its entirety.

TECHNICAL FIELD

The present invention belongs to the field of irradiation damage detection and analysis of semiconductor devices, and particularly relates to a GaN HEMT device for irradiation damage detection and a detection and manufacturing method therefor.

BACKGROUND

Gallium nitride (GaN)-based high electron mobility transistors (HEMTs) are considered to have significant application advantages in high-frequency environment, high-power environment, high-temperature environment, and high-voltage environment due to unique wide bandgap semiconductor material properties. The advantage, combined with excellent radiation resistance, gives such devices great application potential in critical fields such as satellites, space exploration, and nuclear reactors. However, in different application scenarios in aerospace, the radiation performance and operational stability of gallium nitride HEMT devices still have major problems, such as low single-particle burnup voltage and instable threshold voltage. Theoretical and experimental studies have shown that a wide bandgap gallium nitride material has irradiation resistant characteristics, such as high atomic displacement energy. During an actual production process, because a manufacturing process and a structure of a tape out have certain complexity, the irradiation resistant performance of the wide bandgap gallium nitride material will be subjected to relevant impact. For example, a gallium nitride material manufactured by a heterogeneous epitaxial growth technique has a certain quantity of point defects and line defects, and even large area heterogeneity. Combined with more complex heterojunction design in the HEMT devices, the devices are extremely sensitive to externally introduced irradiation effects. In an operating state, the performance and stability of the devices are affected due to uneven distribution of a lateral electric field of the devices, especially the presence of a spike electric field on one side of a gate that is close to the drain.

Therefore, in order to demonstrate the properties and the advantages of the GaN devices in irradiation environments and the maturity of a technology, it is necessary to further strengthen design of a GaN device, investigate static and dynamic degradation mechanisms of the devices in the irradiation environments, and propose a systematic and comprehensive characterization method for materials and devices after irradiation, so as to thoroughly investigate damage and failure mechanisms of the devices due to irradiation.

SUMMARY

In accordance with the current lack of a systematic and comprehensive irradiation damage characterization method, the present invention aims to provide a technique for irradiation damage detection of a GaN HEMT device and a realization method. Through an electroluminescence means, before and after irradiation to the GaN HEMT device, in a vertical direction, light-emitting wavelength and intensity of characteristic light after passing through a transparent electrode are acquired, and in a horizontal direction, in the region pointing towards a drain from a source, the light intensity of the characteristic light after passing through a specified transparent electrode at different potentials is acquired, and the acquired data is analyzed and compared, thereby realizing analysis and determination for the types and the positions of defects affecting the degradation of the material and the GaN HEMT device after irradiation.

In order to realize the purpose, the present invention provides the following technical solution.

A GaN HEMT device for irradiation damage detection includes a substrate layer, a gallium nitride layer, a barrier layer and a dielectric layer, a p-type gallium nitride layer is provided on the barrier layer and the p-type gallium nitride layer is annular-shaped, wherein a drain and a source are respectively located at an inner side and an outer side of the p-type gallium nitride layer, and the drain and the source are provided on the gallium nitride layer, both the drain and the source are transparent, the source is annular-shaped, a Schottky metal layer is provided on the p-type gallium nitride layer and the Schottky metal layer is annular-shaped and semi-transparent, a first ohmic metal layer is located between the source and the p-type gallium nitride layer and is provided on the barrier layer, the first ohmic metal layer is annular-shaped and transparent, a second ohmic metal layer is located between the drain and the p-type gallium nitride layer and is provided on the barrier layer, the second ohmic metal layer is annular-shaped and transparent, and the second ohmic metal layer comprises a plurality of inner gear electrodes and a plurality of outer gear electrodes, which are interdigital with each other, a gap exists between each inner gear electrode and each outer gear electrode, and the first ohmic metal layer and the second ohmic metal layer are ITO transparent electrodes.

Preferably, tooth roots of the plurality of inner gear electrodes are connected to an outer ring to form a whole, and the outer ring is in contact with the p-type gallium nitride layer; tooth roots of the plurality of the outer gear electrodes are connected to an inner ring to form a whole, and a gap exists between the inner ring and the drain; and tooth tips of the plurality of inner gear electrodes point towards the inner ring and have a gap with the inner ring, and tooth tips of the plurality of outer gear electrodes point towards the outer ring and have a gap with the outer ring.

Preferably, the number z of gears of the inner gear electrodes is taken as an integer between $\pi d_1/5$ μm and $\pi d_2/3$ μm, wherein $d_1$ is a distance from the p-type gallium nitride layer to the drain, and $d_2$ is a diameter of the drain; a gear gap $p_1$ between two adjacent inner gear electrodes is calculated by a formula of $p_1=\pi(d_1-2)/z+L_2$, wherein $L_2$ is a length of a tooth tip arc of each outer gear electrode, a tooth height h of each inner gear electrode is less than $d_1-5$ μm; a gear gap $p_2$ between two adjacent outer gear electrodes is calculated by a formula of $p_2=\pi(d_1+2)/z+L_1$, wherein $L_1$ is a length of a tooth tip arc of each inner gear electrode; and the tooth height of each outer gear electrode is equal to that of each inner gear electrode; a width $x_1$ of the outer ring is 2-5 μm, a width $x_2$ of the inner ring is 2-5 μm, a gap $x_3$ between the inner ring and the drain is 1.5-2.5 μm and the gap between the inner ring and the drain is filled with the dielectric layer with a thickness of 150 nm-200 nm; and a gap $x_4$ between a tooth tip of each inner gear electrode and the inner ring is 1-2 μm, a gap $x_5$ between a tooth tip of each outer gear electrode and the outer ring is 1-2 μm, and a gap $x_6$ between each inner gear electrode and one outer gear electrode adjacent thereto is 1-2 μm.

Preferably, a value of $L_1$ is greater than $30° \pi(d_2/2+x_3+x_2+x_4)/180°$ and less than $60° \pi(d_2/2+x_3+x_2+x_4)/180°$, a curvature of a tooth root connecting arc of each inner gear electrode is ½-⅓ μm$^{-1}$, the tooth root connecting arc of each inner gear electrode is tangent to the outer ring, an area $S_1$ of each inner gear electrode is approximately equal to $L_1(d_1-x_1-x_2-x_3-x_4+d_2/2)$, and a length of a backlash arc of each inner gear electrode is $x_7$ with a value range of $L_2+2<x_7<L_2+4$; a gap $x_5$ between the tooth tip of each outer gear electrode and the outer ring is 1-2 μm, a value of $L_2$ is greater than $30° \pi(d_1+d_2/2-x_5-x_1)/180°$ and less than $60° \pi(d_1+d_2/2-x_5-x_1)/180°$, an area $S_2$ of each outer gear electrode is approximately equal to $L_2(d_1-x_1-x_5-x_2-x_3+d_2/2)$, a length of a backlash arc of each outer gear electrode is $x_8$ with a value range of $L_1+2<x_8<L_1+4$, a curvature of a tooth root connecting arc of each outer gear electrode is ½-⅓ μm$^{-1}$ and the tooth root connecting arc of each outer gear electrode is tangent to the inner ring; and both connecting arcs on two sides of the tooth tip arc of each inner gear electrode and connecting arcs on two sides of the tooth tip arc of each outer gear electrode are semicircular arcs with a curvature of 1-½ μm$^{-1}$, and the semicircular arcs of each inner gear electrode are tangent to the tooth tip arc of each inner gear electrode, the semicircular arcs of each outer gear electrode are tangent to the tooth tip arc of each outer gear electrode; the inner gear electrodes have the same gear size and shape; and the outer gear electrodes have the same gear size and shape.

Preferably, the Schottky metal layer is a semi-transparent electrode which is evaporated with a Ni layer with a thickness of 4-7 nm and a Cr layer with a thickness of 5-8 nm; both the source and the drain are transparent electrodes sputtered with a ITO layer with a thickness of 85-100 nm; both the first ohmic metal layer and the second ohmic metal layer are transparent electrodes sputtered with a ITO layer with a thickness of 65-90 nm; an inner side of the first ohmic metal layer is in contact with the p-type gallium nitride layer, a gap x between an outer side of the first ohmic metal layer and the source is 1-2 μm, and the gap between the outer side of the first ohmic metal layer and the source is filled with the dielectric layer with a thickness of 150-200 nm; a ring width $W_1$ of the first ohmic metal layer is 4-6 μm; and a curvature $K_1$ of the inner ring satisfies an inequality of $1/(1+d_1) \geq K_1 \geq 1/d_1$, and a curvature $K_2$ of the outer ring satisfies an inequality of $K_1 \geq K_2 \geq 1/(d_1+W_1-x)$, $d_1$ is a distance from the p-type gallium nitride layer to the drain.

Preferably, electroluminescence is used to respectively acquire data of light-emitting wavelength, intensity and regions for the GaN HEMT device before and after irradiation in the vertical direction and in the horizontal direction, and two sets of data before and after irradiation are compared and analyzed for the light-emitting regions, the wavelength and the intensity, so as to confirm the type of defects generated in the respective regions.

Preferably, a data acquisition method in the vertical direction before and after irradiation includes as follows:

at low gate voltage, acquiring spectral data which is sent by the p-type gallium nitride layer and passes through the Schottky metal layer; at relatively high gate voltage, acquiring the spectral data which is sent by the barrier layer and passes through the inner gear electrodes, the outer gear electrodes, and the Schottky metal layer; and at high gate voltage, acquiring the spectral data which is sent by the gallium nitride layer and passes through the inner gear electrodes, the outer gear electrodes, and the Schottky metal layer.

Preferably, a data acquisition method in the horizontal direction before and after irradiation includes as follows:

the first ohmic metal layer is connected to a positive potential, the drain is connected to a negative potential, and the spectral data of the barrier layer that is not covered with the p-type gallium nitride layer is acquired; the outer gear electrodes are connected to the positive potential, the source is connected to the negative potential, and the spectral data of the barrier layer that is not covered with the p-type gallium nitride layer is acquired; and the outer gear electrodes are connected to the positive potential, the inner gear electrodes are connected to the negative potential, and the spectral data of the barrier layer that is covered with the second ohmic metal layer is acquired.

On the basis of the above solution design being free from other changes, further preferably, a design in which areas covered by gear electrodes are sequentially increased is adopted, the length of the tooth tip arc of each inner gear electrode is $L_x$, $L_x=L_{x-1}+5° \pi(d_2/2+x_3+x_2+x_4)/180°$, and $L_{x-1}>30° \pi(d_2/2+x_3+x_2+x_4)/180°$; an area $S_x$ of each inner gear electrode is approximately equal to $L_x(d_1-x_1-x_2-x_4-d_2/2)$; and a curvature of a tooth root connecting arc of each inner gear electrode is ½-⅓ μm$^{-1}$, the tooth root connecting arc of each inner gear electrode is tangent to the outer ring, a length of a backlash arc of each inner gear electrode is $x_7$ with a value range of $L_{outer}+2<x_7<L_{outer}+4$, a length $L_{outer}$ of a tooth tip arc of each outer gear electrode is greater than $30° \pi(d_1-x_5-x_1)/180°$, and a length of a backlash arc of each outer gear electrode is $x_8$ with a value range of $L_x+2<x_8<L_x+4$.

A manufacturing method for the GaN HEMT device for irradiation damage detection, includes the following steps:

1) sequentially growing the gallium nitride layer, the barrier layer, and the p-type gallium nitride layer on the substrate layer to obtain an epitaxial wafer, and removing the p-type gallium nitride layer in a non-graphic region by using an inductively coupled plasma dry etching method, such that only the gate region retains the p-type gallium nitride layer;

2) growing the dielectric layer on the entire epitaxial wafer by using a plasma enhanced chemical vapor deposition method, and etching the regions of the dielectric layer and the barrier layer corresponding to the source and the drain by an inductively coupled plasma dry etching method and an photolithographic stripping method, and depositing an ITO film by a magnetron sputtering method to form the source and the drain; next, etching the dielectric layer between the source and the p-type gallium nitride layer, and between the p-type gallium nitride layer and the drain, depositing an ITO film by the magnetron sputtering method, and then enabling the ITO film to be exposed and developed by a wet etching method and the photolithographic stripping method to form patterns of the first ohmic metal layer, the inner gear electrodes, and the outer gear electrodes; next, etching the ITO film which is not protected by photoresist to form electrodes; finally, etching the dielectric layer and depositing the Schottky metal layer on the top of the p-type gallium nitride layer; and 3) covering a passivation layer on the entire epitaxial wafer and opening windows above the corresponding regions of the first ohmic metal layer, the inner gear electrodes, the outer gear electrodes and the Schottky metal layer, such that electroluminescence can be acquired efficiently, to complete preparation of the GaN HEMT device.

Compared with the prior art, the beneficial effects of the present invention are as follows:

the innovation of the present invention mainly lies in a structure and an analysis process of a luminescence window as an electroluminescence acquisition region. The transparent electrodes (i.e., the inner gear electrodes and the outer gear electrodes) between the gate (i.e., the p-type gallium nitride layer) and the drain are used as a main light outlet in the horizontal direction, and by constructing interdigital gear electrodes, on one hand, the two gear electrodes are independent of each other and are not in contact with each other, but cover all the regions from the gate to the drain, thereby enlarging the acquisition range; and each gear electrode is used as a single individual, but distances the gear electrodes cover from the gate to the drain are the same, i.e., all the gear electrodes are control groups for each other, thereby improving the acquisition accuracy of the spectral data. In a preferred embodiment, the areas covered by the gear electrodes are sequentially increased on the basis of ensuring that the gear electrodes cover constant distances from the gate to the drain. All the gear electrodes serve both as a reference for each other and as a means of probing the uniformity of irradiation-induced degradation in the device. The electrodes, which are interdigital with each other and independent of each other, allow for more precise region detection at different potentials. Through a constructed test and analysis process, the types and the positions of defects caused by irradiation in different layers and regions can be detected.

The GaN HEMT device provided by the present invention can monitor changes in the light-emitting wavelength, the intensity and the regions of the various layers of the material of the GaN HEMT device before and after irradiation from different dimensions by performing data acquisition in the vertical direction (through gate voltage regulation and control) and in the horizontal direction (through different electrode configurations) so as to comprehensively and accurately identify the types and distributions of defects generated in the various layers and regions of the device. The multi-dimensional detection capability is favorable for an in-depth understanding of radiation damage mechanisms and improves the accuracy of reliability assessment of the device.

In the figures: 1—substrate layer; 2—gallium nitride layer; 3—barrier layer; 4—p-type gallium nitride layer; 5—drain; 6—source; 7—Schottky metal layer; 8—first ohmic metal layer; 9—second ohmic metal layer; 901—inner gear electrode; 902—outer gear electrode; 903—outer ring; 904—inner ring.

DETAILED DESCRIPTION OF THE EMBODIMENTS

In order to enable those skilled in the field to better understand the technical solution of the present invention, the following describes the preferred embodiment of the present invention in combination with specific embodiments, but it should be understood that the accompanying drawings are only used for exemplary illustration, and should not be construed as a limitation on the present patent; in order to better illustrate the present embodiment, certain parts of the accompanying drawings will be omitted, enlarged or reduced, and do not represent the dimensions of an actual product; and for those skilled in the art, it is understandable that certain well-known structures and their descriptions in the accompanying drawings may be omitted. The positional relationships depicted in the accompanying drawings are only for exemplary illustration and are not to be construed as a limitation of the present patent.

Figure 1:
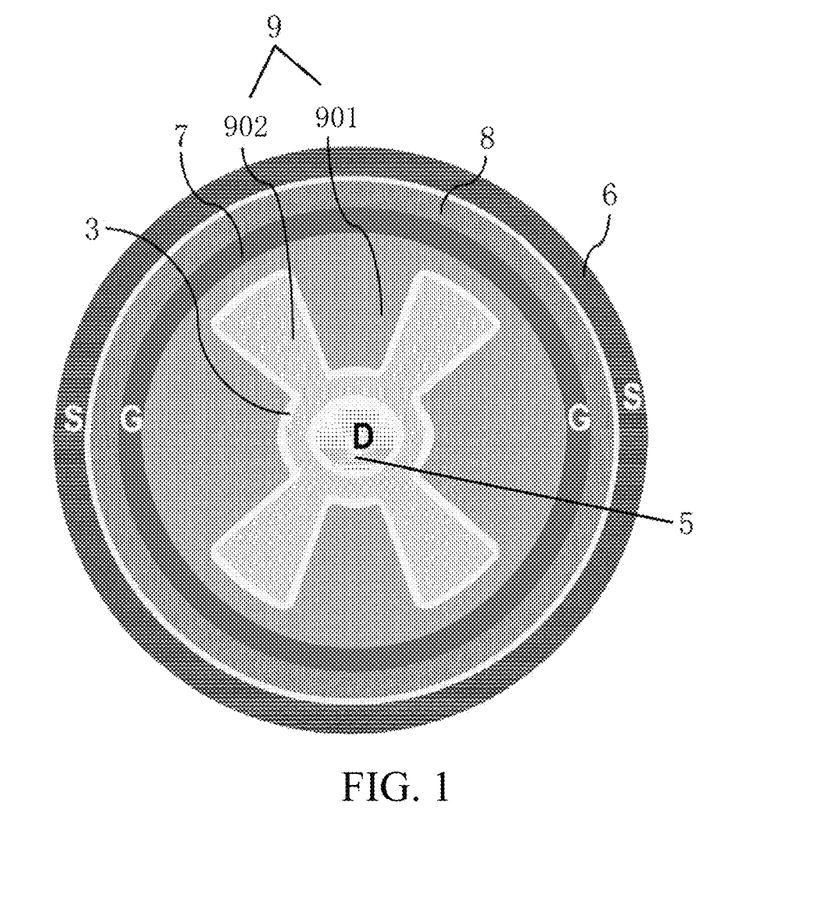
FIG. 1 shows a schematic diagram of a planar structure of a GaN HEMT device of the present invention.
Figure 2:
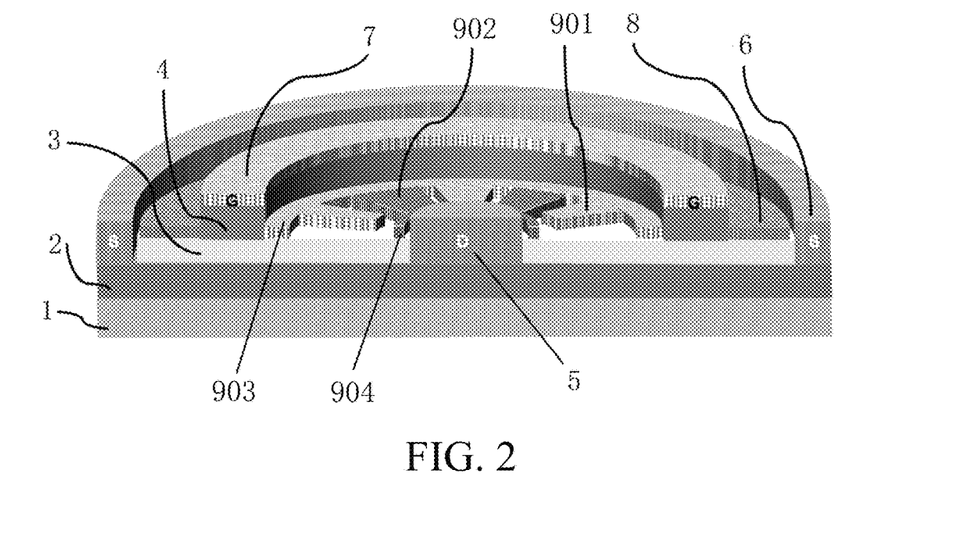
FIG. 2 shows a schematic diagram of a sectional structure of a GaN HEMT device of the present invention.
Figure 5:
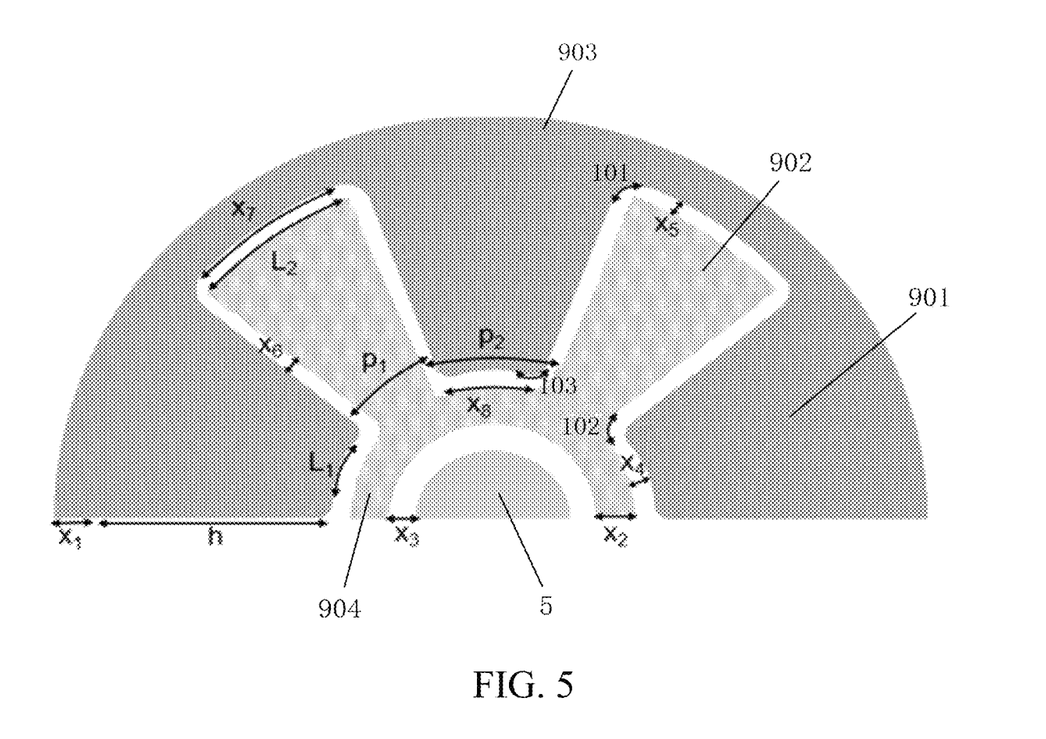
FIG. 5 shows a schematic diagram of corresponding positions of relevant parameters of inner gear electrodes and outer gear electrodes.

As shown in FIGS. 1-2 and FIG. 5, a GaN HEMT device for irradiation damage detection in the embodiment includes a substrate layer 1, a gallium nitride layer 2, a barrier layer 3, and a dielectric layer (not shown). A p-type gallium nitride layer 4 is provided on the barrier layer 3 and is annular-shaped. A drain 5 and a source 6 are respectively located at an inner side and an outer side of the p-type gallium nitride layer 4. Both the drain 5 and the source 6 are transparent. The drain 5 is in a cylindrical form and the source 6 is annular-shaped. The drain 5 penetrates through the barrier layer 3 and is provided on the gallium nitride layer 2. The source 6 is located at an outer side of the barrier layer 3 and is provided on the gallium nitride layer 2. The annular electrode close to the p-type gallium nitride layer 4 is the source 6, and the cylindrical electrode which is far from the p-type gallium nitride layer 4 is the drain 5. A space between the p-type gallium nitride layer 4 and the source 6 and a space between the p-type gallium nitride layer 4 and the drain 5 are filled with the dielectric layer. A Schottky metal layer 7 is provided on the p-type gallium nitride layer 4, and the Schottky metal layer 7 is annular-shaped and semi-transparent. A first ohmic metal layer 8 is located between the source 6 and the p-type gallium nitride layer 4 and is provided on the barrier layer 3, and the first ohmic metal layer 8 is transparent and annular-shaped. A second ohmic metal layer 9 is located between the drain 5 and the p-type gallium nitride layer 4 and is provided on the barrier layer 3. The second ohmic metal layer 9 is annular-shaped and transparent. The second ohmic metal layer 9 includes a plurality of inner gear electrodes 901 and a plurality of outer gear electrodes 902, which are interdigital with each other. A gap exists between each inner gear electrode 901 and each outer gear electrode 902. In FIGS. 1-2, G denotes the gate, S denotes the source, and D denotes the drain.

Specifically, an outer ring 903 is provided between the second ohmic metal layer 9 and the p-type gallium nitride layer 4, and an inner ring 904 is provided between the drain 5 and the second ohmic metal layer 9. Tooth roots of the plurality of inner gear electrodes 901 are all connected to an outer ring 903 to form a whole. The outer ring 903 is in contact with the p-type gallium nitride layer 4. Tooth roots of the plurality of outer gear electrodes 902 are all connected to an inner ring 904 to form a whole. A gap exists between the inner ring 904 and the drain 5. Tooth tips of the plurality of inner gear electrodes 901 all point towards the inner ring 904 and have a gap with the inner ring 904. Tooth tips of the plurality of outer gear electrodes 902 all point towards the outer ring 903 and have a gap with the outer ring 903. The coverage areas of the inner gear electrodes 901 and the outer gear electrodes 902 are increased in a direction from the tooth roots to the tooth tips.

As can be seen from the above structural design, through the design of the annular p-type gallium nitride layer 4, the transparent drain 5, the transparent source 6, the semi-transparent Schottky metal layer 7, and the first ohmic metal layer 8 which is annular-shaped and transparent and the second ohmic metal layer 9 which is annular-shaped and transparent (the inner gear electrodes 901 and the outer gear electrodes 902) which are unique, effective control and precise acquisition for light-emitting regions are realized. The interdigital structures of the inner gear electrodes 901 and the outer gear electrodes 902 not only cover all regions from the gate to the drain, enlarging the acquisition range, but also ensures that all the gears cover the same distance from the gate to the drain, forming a cross reference and enhancing the acquisition accuracy of the spectral data. In addition, refined regulation and control on parameters of the length of the tooth tip arc, the tooth height, and gear gaps of the gear electrodes, the curvature of the tooth root connecting arc, etc. is conducive to further optimization of luminescence efficiency and signal acquisition quality.

In some examples, the number z of gears of the inner gear electrodes 901 is taken as an integer between $\pi d_1/5$ μm and $\pi d_2/3$ μm, z=20, where $d_1$=20 μm and $d_1$ is a distance from the p-type gallium nitride layer 4 to the drain 5, $d_2$=60 μm and $d_2$ is a diameter of the drain 5. A gear gap $p_1$ between two adjacent inner gear electrodes 901 is calculated by a formula of $p_1=\pi(d_1-2)/z+L_2$, where $L_2$ is a length of a tooth tip arc of each outer gear electrode 902, and specially, $p_1$ is equal to 16.5 μm. A tooth height h of each inner gear electrode 901 is equal to 12 μm which is less than $d_1-5$ μm. A gear gap $p_2$ between two adjacent outer gear electrodes 902 is calculated by a formula of $p_2=\pi(d_1+2)/z+L_1$, where $L_1$ is a length of a tooth tip arc of each inner gear electrode 901, and specially, $p_2$ is equal to 22.5 μm. The tooth height of each outer gear electrode 902 is equal to that of each inner gear electrode 901. The width $x_1$ of the outer ring 903 is 3 μm. The width $x_2$ of the inner ring 904 is 3 μm. A gap $x_3$ between the inner ring 904 and the drain 5 is 2 μm, and the gap between the inner ring 904 and the drain 5 is filled with the dielectric layer with a thickness of 170 nm. The gap $x_4$ between a tooth tip of each inner gear electrode 901 and the inner ring 904 is 2 μm. A gap $x_5$ between a tooth tip of each outer gear electrode 902 and the outer ring 903 is 2 μm. A gap $x_6$ between each inner gear electrode 901 and one outer gear electrode 902 adjacent thereto is 2 μm. Herein, the ring width refers to an outer radius minus an inner radius.

In some examples, a length $L_1$ of a tooth tip arc of each inner gear electrode 901 is equal to 19 μm, with a value range of 30° $\pi(d_2/2+x_3+x_2+x_4)/180°<L_1<60°$ $\pi(d_2/2+x_3+x_2+x_4)/180°$. A curvature of a tooth root connecting arc of each inner gear electrode 901 is 0.5 μm$^{-1}$, and the tooth root connecting arc 101 of each inner gear electrode 901 is tangent to the outer ring 903. An area $S_1$ of each inner gear electrode 901 is equal to 760 μm$^2$, which is approximately equal to $L_1(d_1-x_1-x_2-x_3-x_4+d_2/2)$. A length $x_7$ of a backlash arc of each inner gear electrode 901 is equal to 18 μm, with a value range of $L_2+2<x_7<L_2+4$. The gap $x_5$ between the tooth tip of each outer gear electrode 902 and the outer ring 903 is 2 μm. The length $L_2$ of the tooth tip arc of each outer gear electrode 902 is equal to 14 μm, with a value range of 30° $\pi(d_1+d_2/2-x_5-x_1)/180°<L_2<60°$ $\pi(d_1+d_2/2-x_5-x_1)/180°$. An area $S_2$ of each outer gear electrode 902 is equal to 560 μm$^2$, which is approximately equal to $L_2(d_1-x_1-x_5-x_2-x_3+d_2/2)$. A length $x_8$ of a backlash arc of each outer gear electrode 902 is equal to 22 μm, with a value range of $L_1+2<x_8<L_1+4$. A curvature of a tooth root connection arc 102 of each outer gear electrode 902 is 0.5 μm$^{-1}$. The tooth root connecting arc 102 of each outer gear electrode 902 is tangent to the inner ring 904. Connecting arcs 103 on two sides of the tooth tip arc of each inner gear electrode 901 are semicircular arcs with the curvature of 0.5 μm$^{-1}$. Similarly, connecting arcs on two sides of the tooth tip arc of each outer gear electrode 902 are semicircular arcs with the curvature of 0.5 μm$^{-1}$. The semicircular arcs of each inner gear electrode 901 are tangent to the tooth tip arc of each inner gear electrode 901, and the semicircular arcs of each outer gear electrode 902 are tangent to the tooth tip arc of each outer gear electrode 902. The inner gear electrodes 901 have the same gear size and shape. The outer gear electrodes 902 have the same gear size and shape.

In some examples, the Schottky metal layer 7 is a semi-transparent electrode evaporated with a Ni layer with a thickness of 6 nm and a Cr layer with a thickness of 8 nm, which serves as a main light outlet of characteristic light in the vertical direction. The source 6 and the drain 5 are both transparent electrodes sputtered with an ITO layer with a thickness of 90 nm. Both the first ohmic metal layer 8 and the second ohmic metal layer 9 are transparent electrodes sputtered with an ITO layer with a thickness of 70 nm, which serve as light outlets of characteristic light in the horizontal direction. In order to achieve a higher light output rate, a preferred ITO annealing temperature is 450° C., annealing time is about 60 s, and the ITO layer after deposition is wet-etched in a concentrated sulfuric acid solution at 65° C. for 6 min to increase the light output rate. The inner surface of the first ohmic metal layer 8 is in contact with the p-type gallium nitride layer 4. A gap x between the outer surface of the first ohmic metal layer 8 and the source 6 is 2 μm, and the gap between the outer surface of the first ohmic metal layer 8 and the source 6 is filled with the dielectric layer with a thickness of 170 nm. In order to ensure effective acquisition of the light-emitting region while achieving certain performance of the device, the ring width $W_1$ of the first ohmic metal layer 8 is 5 μm. A curvature $K_1$ of the inner ring 904 is equal to 0.055, satisfying $1/(1+d_1) \geq K_1 \geq 1/d_1$, and a curvature $K_2$ of the outer ring 903 is equal to 0.046, satisfying an inequality of $K_1 \geq K_2 \geq 1/(d_1+W_1-x)$, wherein x is the gap distance between the outer surface of the first ohmic metal layer 8 and the source 6, and $d_1$ is the distance from the p-type gallium nitride layer 4 to the drain 5.

Based on the structural design of the GaN HEMT device, electroluminescence is used to respectively acquire data of light-emitting wavelength, intensity and regions for the GaN HEMT device before and after irradiation in the vertical direction and in the horizontal direction, and two sets of data before and after irradiation are compared and analyzed for the light-emitting region, the wavelength, and the intensity, so as to confirm the type of defects generated in the respective regions. Specific acquisition and analysis methods are as below.

Figure 3A:
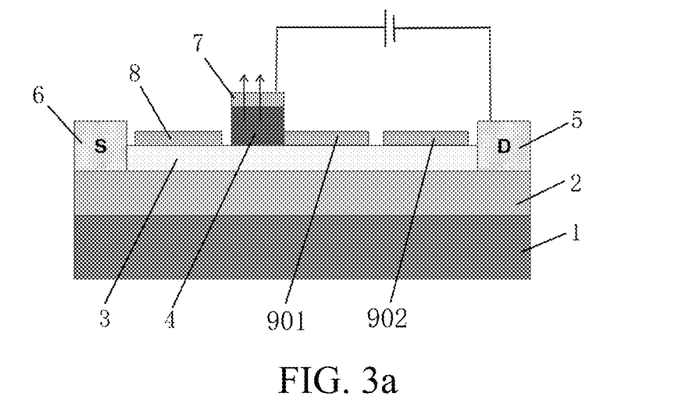
FIG. 3a shows a schematic principle diagram of acquisition and analysis in a corresponding vertical direction at low gate voltage.
Figure 3B:
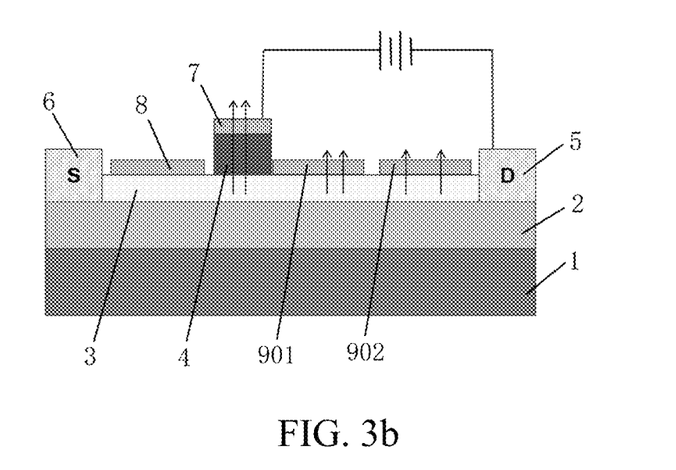
FIG. 3b shows a schematic principle diagram of acquisition and analysis in a corresponding vertical direction at relatively high gate voltage.
Figure 3C:
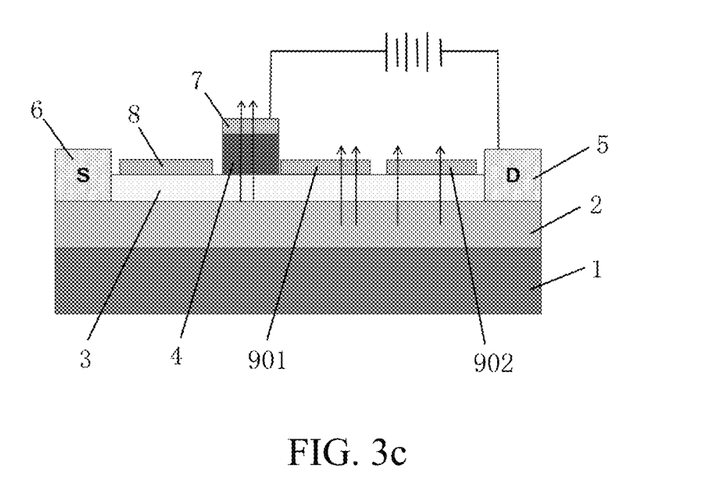
FIG. 3c shows a schematic principle diagram of acquisition and analysis in a corresponding vertical direction at high gate voltage.

As shown in FIGS. 3*a*-3*c*, a data acquisition method in the vertical direction before and after irradiation is as follows.

As shown in FIG. 3*a*, at low gate voltage (3.5-5 V), in the p-type gallium nitride (GaN) layer 4, channel electrons firstly relax to a deep donor level, holes relax to a deep acceptor level, and the channel electrons and the holes are recombined in P-GaN (Gallium nitride) to emit out red light of 1.8 eV, which is acquired through the Schottky metal layer 7. As shown in FIG. 3*b*, at relatively high gate voltage (5.5-7 V), the holes in the barrier layer 3 firstly relax to the deep acceptor level, and then are recombined with the channel electrons to emit out yellow light of 2.2 eV, which is acquired through the inner gear electrodes 901 and the outer gear electrodes 902, part of the yellow light passes through the Schottky metal layer 7, and the light-emitting intensity of the inner gear electrodes 901 and the outer gear electrodes 902 is higher than that of the Schottky metal layer 7. The yellow light passing through the Schottky metal layer 7 corresponds to the barrier layer 3 covered with the p-type gallium nitride layer 4, and the light passing through the inner gear electrodes 901 and the outer gear electrodes 902 corresponds to the barrier layer 3 covered with the inner gear electrodes 901 and the outer gear electrodes 902. As shown in FIG. 3*c*, at the high gate voltage (7.5-9 V), the holes and the electrons in the gallium nitride layer 2 are subjected to band edge radiation recombination to emit out ultraviolet light of 3.4 eV, which is acquired through the inner gear electrodes 901 and the outer gear electrodes 902, and part of the ultraviolet light passes through the Schottky metal layer 7. The light-emitting intensity of the inner gear electrodes 901 and the outer gear electrodes 902 is higher than that of the Schottky metal layer 7. In FIGS. 3*a*-3*c*, S denotes the source, and D denotes the drain.

As can be seen from the above design, three levels of low gate voltage, relatively high gate voltage and high gate voltage are designed to adapt to luminescence detection needs under different conditions, such as recombination of the channel electrons and the holes at different energy levels. This design is capable of capturing luminescence information at different energy levels, such as the red light, the yellow light, and the ultraviolet light, which is favorable for is comprehensively revealing of the effects of different radiation doses and energy on the performance of the GaN HEMT device, thereby improving the sensitivity and resolution of radiation damage identification.

Figure 4A:
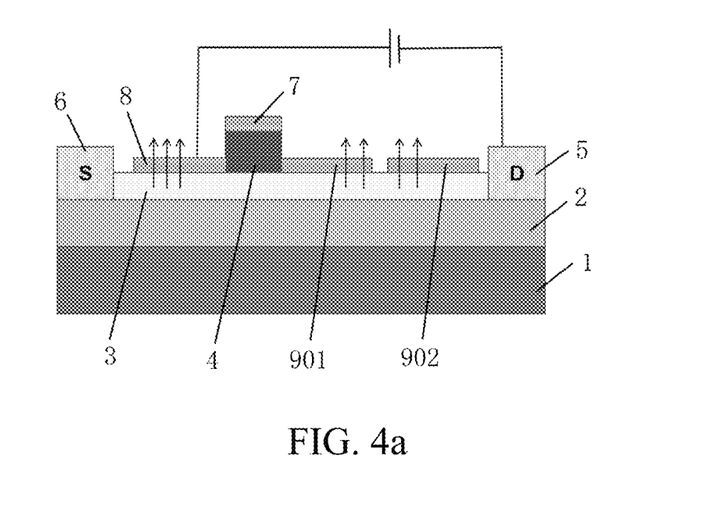
FIG. 4a shows a schematic principle diagram of acquisition and analysis in the corresponding horizontal direction when a first ohmic metal layer is connected to a positive potential and a drain is connected to a negative potential.
Figure 4B:
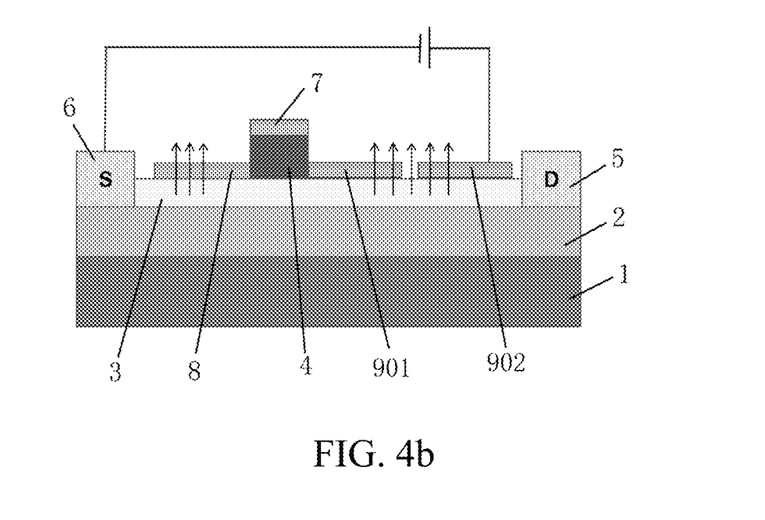
FIG. 4b shows a schematic principle diagram of acquisition and analysis in the corresponding horizontal direction when outer gear electrodes are connected to a positive potential and a source is connected to a negative potential.
Figure 4C:
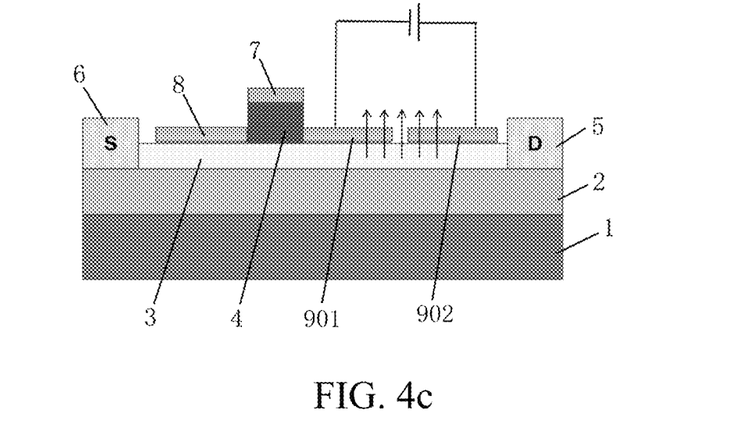
FIG. 4c shows a schematic principle diagram of acquisition and analysis in the corresponding horizontal direction when outer gear electrodes are connected to a positive potential and inner gear electrodes are connected to a negative potential.

As shown in FIGS. 4*a*-4*c*, a data acquisition method in the horizontal direction before and after irradiation is as follows.

As shown in FIG. 4*a*, the first ohmic metal layer 8 is connected to the positive potential and the drain 5 is connected to the negative potential. An interface between the gallium nitride layer 2 and the barrier layer 3 emits out blue light due to electron-hole pairs recombination, which is acquired by an electroluminescence device through the first ohmic metal layer 8, the inner gear electrodes 901 and the outer gear electrodes 902, and an acquisition region is the barrier layer 3 that is not covered with the p-type gallium nitride layer 4. As shown in FIG. 4*b*, the outer gear electrodes 902 are connected to the positive potential, the source 6 is connected to the negative potential, an interface between the gallium nitride layer 2 and the barrier layer 3 emits out blue light due to the electron-hole recombination, which is acquired by the electroluminescence device through the first ohmic metal layer 8, the inner gear electrodes 901 and the outer gear electrodes 902, and the acquisition region is the barrier layer 3 that is not covered with the p-type gallium nitride layer 4. As shown in FIG. 4*c*, the outer gear electrodes 902 are connected to the positive potential and the inner gear electrodes 901 are connected to the negative potential. An interface between the gallium nitride layer 2 and the barrier layer 3 below the corresponding electrodes emits out blue light due to the electron-hole recombination, which is acquired by the electroluminescence device through the inner gear electrodes 901 and the outer gear electrodes 902, and the acquisition region is the barrier layer 3 that is covered with the inner gear electrodes 901 and the outer gear electrodes 902. In FIGS. 4*a*-4*c*, S denotes the source, and D denotes the drain.

As can be seen from the above design, by changing the distribution of positive and negative potentials among different electrodes, such as the first ohmic metal layer 8, the source 6, the drain 5, the inner gear electrodes 901, and the outer gear electrodes 902, during a data acquisition process in the horizontal direction, light-emitting signals from different device regions, such as the barrier layer 3 covered with the first ohmic metal layer 8 and the second ohmic metal layer 9, can be excited and collected in a targeted manner. This design greatly enriches detection means, facilitates the analysis of the effect of radiation on different structural units, and is favorable for identification of local defects and non-uniform degradation phenomena.

Figure 6:
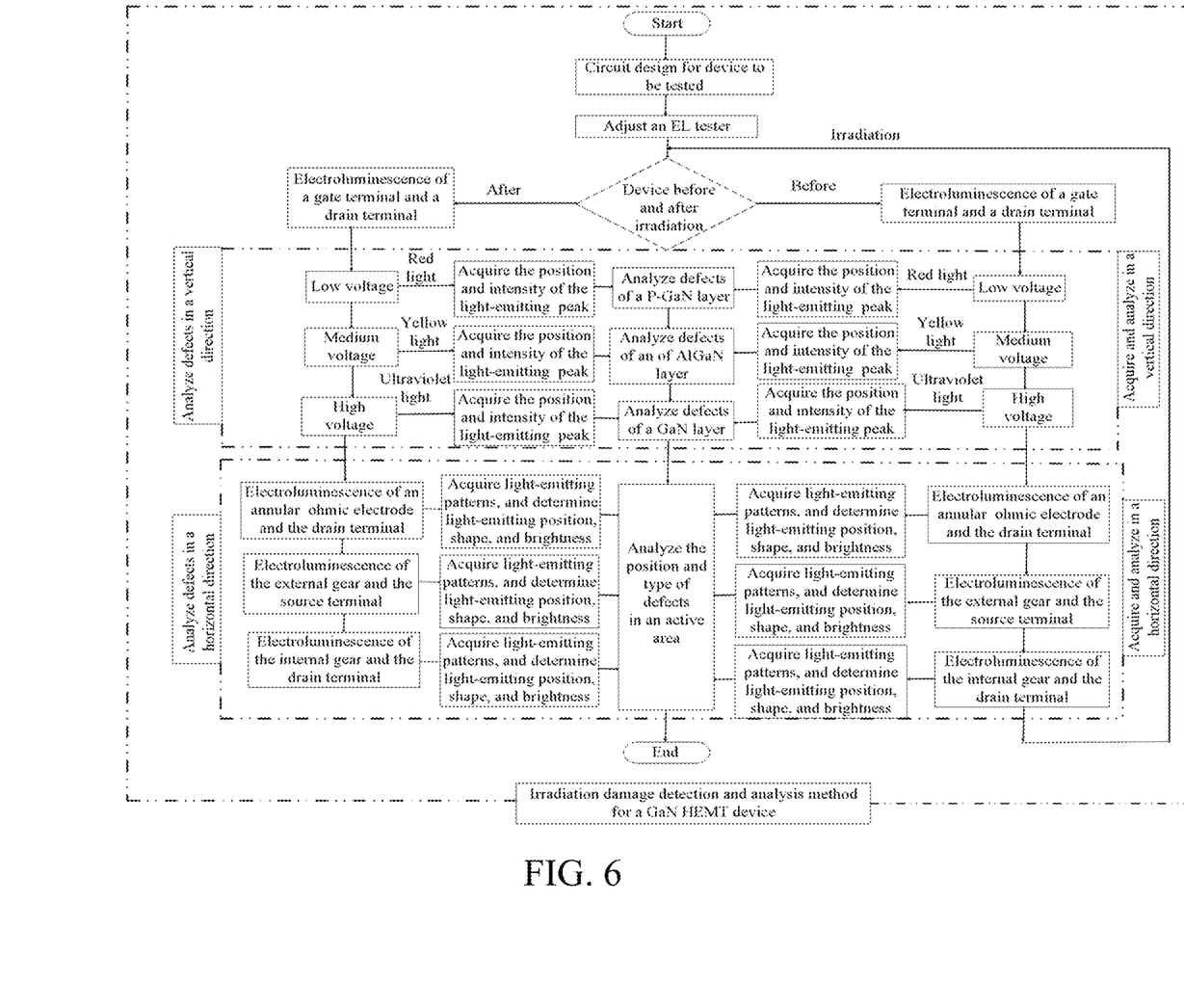
FIG. 6 shows a flowchart of a method for detecting irradiation damage in a GaN HEMT device of the present invention.

An analytical test process as shown in FIG. 6 is performed on both the devices before and after irradiation. The light-emitting wavelength, the intensity, and the regions of the device in the vertical direction and the horizontal direction were acquired and analyzed by electroluminescence (EL) to confirm the types of defects generated in the respective regions.

The present invention provides a standardized process including acquisition and analysis of the light-emitting wavelength, the intensity, and the regions of the device in the vertical direction and the horizontal direction by electroluminescence (EL), which is able to systematically and normatively assess changes in the performance of the devices before and after irradiation, is favorable for quick and accurate identification of the types and positions of defects, and provides a reliable basis for prevention and repair of radiation damage, and optimization of the performance of the device.

Based on the above structural design, the present invention provides a manufacturing method for the GaN HEMT device for irradiation damage detection, comprising the following steps:

1) sequentially growing the gallium nitride layer 2, the barrier layer 3 and the p-type gallium nitride layer 4 on the substrate layer 1 to obtain an epitaxial wafer, and removing the p-type gallium nitride layer 4 in a non-graphic region by using an inductively coupled plasma dry etching method, such that only the gate region retains the p-type gallium nitride layer 4;
2) growing the dielectric layer on the entire epitaxial wafer by using a plasma enhanced chemical vapor deposition method, and etching the regions of the dielectric layer and the barrier layer 3 corresponding to the source 6 and the drain 5 by an inductively coupled plasma dry etching method and a photolithographic stripping method, and depositing an ITO film by a magnetron sputtering method to form the source 6 and the drain 5; next, etching the dielectric layer between the source and the p-type gallium nitride layer 4, and between the p-type gallium nitride layer 4 and the drain 5, depositing an ITO film by the magnetron sputtering method, and then enabling the ITO film to be exposed and developed by a wet etching method and the photolithographic stripping method to form patterns of the first ohmic metal layer 8, the inner gear electrodes 901 and the outer gear electrodes 902; next, etching the ITO film which is not protected by photoresist to form electrodes; finally, etching the dielectric layer and depositing the Schottky metal layer on the top of the p-type gallium nitride layer 4; and 3) covering a passivation layer on the entire epitaxial wafer and opening windows above the corresponding regions of the first ohmic metal layer 8, the inner gear electrodes 901, the outer gear electrodes 902 and the Schottky metal layer, such that electroluminescence can be acquired efficiently, to complete preparation of the GaN HEMT device.

The present invention uses various process technologies such as epitaxial growth, dry etching, plasma enhanced chemical vapor deposition, magnetron sputtering, wet etching, and photolithographic stripping to achieve efficient integrated preparation of the GaN HEMT device. In particular, by constructing a light-emitting window structure and optimizing electrode patterns, effective acquisition of electroluminescence and maintenance of performance of the device are taken into account, reflecting good process compatibility and practicality.

In summary, according to the GaN HEMT device of the present invention and the manufacturing method therefor, the precision, range and flexibility of radiation damage detection are significantly improved through refined electrode design, multi-layer multi-angle radiation damage detection, gate voltage level design, flexible electrode polarity configuration and a standardized test and analysis process, which is favorable for thoroughly study of the effect of radiation on the performance of the GaN HEMT device and provides a strong technical support for improving the radiation resistance and reliability of the device.

Based on the description and the accompanying drawings of the present invention, those skilled in the art can readily manufacture or use the GaN HEMT device for irradiation damage detection and the manufacturing method therefor of the present invention, and can generate positive effects documented in the present invention.

If not otherwise specified, in the description of the present invention, if the orientations or positional relationships indicated by the terms "length", "width", "up", "down", "front", "back", "left", "right", "vertical", "horizontal", 'top', 'bottom', 'inside', "outside", "clockwise", "counterclockwise", "axial", "radial", "circumferential" and the like are in accordance with those shown in the accompanying drawings, and are intended only for the convenience of describing the present invention and simplifying the description rather than for indicating or implying that the referred devices or elements must have a particular orientation or constructed or operated in a particular orientation; and therefore, the terms used to describe the orientations or the positional relationships in the present invention are only for illustrative purposes and are not to be construed as limiting the present patent, and the specific meaning of the terms described above will be understood by those of ordinary skill in the art in combination with the accompanying drawings according to the specific circumstances.

Unless otherwise explicitly provided and limited, the terms "provided", "connected to" and "connected with" should be understood in a broad sense, for example, a connection may be a fixed connection, a detachable connection or an integral connection; it may be a direct connection or an indirect connection via an intermediate medium; and it may be a connection between two elements. For those of ordinary skilled in the art, the specific meanings of the above terms herein can be understood on a case-by-case basis.

The above are only preferred embodiments of the present invention, and it should be noted that the above preferred embodiment should not be regarded as a limitation of the present invention, and the protection scope of the present invention shall be subject to the scope defined in the claims. For those of ordinary skill in the art, a plurality of improvements and modifications may also be made without departing from the spirit and scope of the present invention, and the improvements and modifications are also regarded to be within the protection scope of the present invention.

What is claimed is:

1. A Gallium nitride-based high electron mobility transistor (GaN HEMT) device for irradiation damage detection, comprising a substrate layer, a gallium nitride layer, a barrier layer and a dielectric layer, a p-type gallium nitride layer is provided on the barrier layer and the p-type gallium nitride layer is annular-shaped, wherein a drain and a source are respectively located at an inner side and an outer side of the p-type gallium nitride layer, and the drain and the source are provided on the gallium nitride layer, both the drain and the source are transparent, and the drain is annular-shaped, a Schottky metal layer is provided on the p-type gallium nitride layer and the Schottky metal layer is annular-shaped and semi-transparent, a first ohmic metal layer is provided on the barrier layer and the first ohmic metal layer is located between the source and the p-type gallium nitride layer, the first ohmic metal layer is annular-shaped and transparent, a second ohmic metal layer is provided on the barrier layer and the second ohmic metal layer is located between the drain and the p-type gallium nitride layer, the second ohmic metal layer is annular-shaped and transparent, and the second ohmic metal layer comprises a plurality of inner gear electrodes and a plurality of outer gear electrodes, which are interdigital with each other, a gap exists between each inner gear electrode and each outer gear electrode, and the first ohmic metal layer and the second ohmic metal layer are indium tin oxide (ITO) transparent electrodes.

2. The GaN HEMT device for irradiation damage detection according to claim 1, wherein tooth roots of the plurality of inner gear electrodes are connected to an outer ring to form a whole, and the outer ring is in contact with the p-type gallium nitride layer; tooth roots of the plurality of the outer gear electrodes are connected to an inner ring to form a whole, and a gap exists between the inner ring and the drain; and tooth tips of the plurality of inner gear electrodes point towards the inner ring and have a gap with the inner ring, and tooth tips of the plurality of outer gear electrodes point towards the outer ring and have a gap with the outer ring.

3. The GaN HEMT device for irradiation damage detection according to claim 2, wherein the number z of gears of the inner gear electrodes is taken as an integer between $\pi d_1/5$ μm and $\pi d_2/3$ μm, wherein $d_1$ is a distance from the p-type gallium nitride layer to the drain, and $d_2$ is a diameter of the drain; a gear gap $p_1$ of the inner gear electrodes is equal to $\pi(d_1-2)/z+L_2$, a tooth height h of each inner gear electrode is less than $d_1-5$ μm, $L_2$ is a length of a tooth tip arc of each outer gear electrode; a gear gap $p_2$ of the outer gear electrodes is equal to $\pi(d_1+2)/z+L_1$, a tooth height of each outer gear electrode is equal to that of the second ohmic metal layer, $L_1$ is a length of a tooth tip arc of each inner gear electrode; a width $x_1$ of the outer ring is 2-5 μm, a width $x_2$ of the inner ring is 2-5 μm, a gap $x_3$ between the inner ring and the drain is 1.5-2.5 μm and the gap between the inner ring and the drain is filled with the dielectric layer with a thickness of 150 nm-200 nm; and a gap $x_4$ between a tooth tip of each inner gear electrode and the inner ring is 1-2 μm, a gap $x_5$ between a tooth tip of each outer gear electrode and the outer ring is 1-2 μm, and a gap $x_6$ between each inner gear electrode and each outer gear electrode is 1-2 μm.

4. The GaN HEMT device for irradiation damage detection according to claim 3, wherein $30° \pi(d_2/2+x_3+x_2+x_4)/180° < L_1 < 60° \pi(d_2/2+\times 3+x_2+x_4)/180°$, a curvature of a tooth root connecting arc of each inner gear electrode is ½-⅓ μm$^{-1}$, the tooth root connecting arc of each inner gear electrode is tangent to the outer ring, an area $S_1$ of each inner gear electrode is approximately equal to $L_1 (d_1-x_1-x_2-x_3-x_4+d_2/2)$, and a length of a backlash arc of each inner gear electrode is $x_7$, $L_2+2<x_7<L_2+4$; a gap $x_5$ between the tooth tip of each outer gear electrode and the outer ring is 1-2 μm, $30° \pi(d_1+d_2/2-x_5-x_1)/180°<L_2<60° \pi(d_1+d_2/2-x_5-x_1)/180°$, an area $S_2$ of each outer gear electrode is approximately equal to $L_2 (d_1-x_1-x_5-x_2-x_3+d_2/2)$, a length of a backlash arc of each outer gear electrode is $x_8$, $L_1+2<x_8<L_1+4$, a curvature of a tooth root connecting arc of each outer gear electrode is ½-⅓ μm$^{-1}$ and the tooth root connecting arc of each outer gear electrode is tangent to the inner ring; and both connecting arcs on two sides of the tooth tip arc of each inner gear electrode and connecting arcs on two sides of the tooth tip arc of each outer gear electrode are semicircular arcs with a curvature of 1-½ μm$^{-1}$, and the semicircular arcs are respectively tangent to the corresponding tooth tip arcs; the inner gear electrodes have the same gear size and shape; and the outer gear electrodes have the same gear size and shape.

5. The GaN HEMT device for irradiation damage detection according to claim 3, wherein the length of the tooth tip arc of each inner gear electrode is $L_x$, $L_x=L_{x-1}+5° \pi(d_2/2+x_3+x_2+\times 4)/180°$ and $L_{x-1}>30° \pi(d_2/2+x_3+x_2+x_4)/180°$; an area $S_x$ of each inner gear electrode is approximately equal to $L_x (d_1-x_1-x_2-x_3-x_4-d_2/2)$; and a curvature of a tooth root connecting arc of each inner gear electrode is ½-⅓ μm$^{-1}$, the tooth root connecting arc of each inner gear electrode is tangent to the outer ring, a length of a backlash arc of each inner gear electrode is $x_7$, $L_{outer}+2<x_7<L_{outer}+4$, a length $L_{outer}$ of a tooth tip arc of each outer gear electrode is greater than $30° \pi(d_1-x_5-x_1)/180°$, and a length of a backlash arc of each outer gear electrode is $x_8$, $L_x+2<x_8<L_x+4$.

6. The GaN HEMT device for irradiation damage detection according to claim 1, wherein the Schottky metal layer is a semi-transparent electrode evaporated with a Ni layer with a thickness of 4-7 nm and a Cr layer with a thickness of 5-8 nm; both the source and the drain are transparent electrodes sputtered with a ITO layer with a thickness of 85-100 nm; both the first ohmic metal layer and the second ohmic metal layer are transparent electrodes sputtered with a ITO layer with a thickness of 65-90 nm; an inner side of the first ohmic metal layer is in contact with the p-type gallium nitride layer, a gap x between an outer side of the first ohmic metal layer and the source is 1-2 μm, and the gap between the outer side of the first ohmic metal layer and the source is filled with the dielectric layer with a thickness of 150-200 nm; a ring width $W_1$ of the first ohmic metal layer is 4-6 μm; and a curvature $K_1$ of the inner ring of the first ohmic metal layer satisfies an inequality of $1/(1+d_1) \geq K_1 \geq 1/d_1$, and a curvature $K_2$ of the outer ring satisfies an inequality of $K_1 \geq K_2 \geq 1/(d_1+W_1-x)$, $d_1$ is a distance from the p-type gallium nitride layer to the drain.

\* \* \* \* \*